United States Patent
Kushida et al.

[11] Patent Number: 6,144,052
[45] Date of Patent: Nov. 7, 2000

[54] SEMICONDUCTOR DEVICE AND ITS MANUFACTURE

[75] Inventors: Keiko Kushida, Kodaira; Masahiko Hiratani, Akishima; Kazuyoshi Torii, Hachiouji; Shinichiro Takatani, Koganei; Hiroshi Miki, Tokyo; Yuuichi Matsui, Kokubunji; Yoshihisa Fujisaki, Fuchuu, all of Japan

[73] Assignee: Hitachi, Ltd., Tokyo, Japan

[21] Appl. No.: 09/142,011

[22] PCT Filed: Mar. 8, 1996

[86] PCT No.: PCT/JP96/00579

§ 371 Date: Aug. 31, 1998

§ 102(e) Date: Aug. 31, 1998

[87] PCT Pub. No.: WO97/33316

PCT Pub. Date: Sep. 12, 1997

[51] Int. Cl.⁷ ............................... H01L 29/72
[52] U.S. Cl. ............ 257/295; 257/298; 257/310; 257/532
[58] Field of Search .................. 257/295, 298, 257/310, 532

[56] References Cited

U.S. PATENT DOCUMENTS 6,051,859  4/2000  Hosotani et al. .............. 257/295

FOREIGN PATENT DOCUMENTS 4-199746  7/1992  Japan .
6-120423  4/1994  Japan .
8-45925   2/1996  Japan .

Primary Examiner—Edward Wojciechowicz
Attorney, Agent, or Firm—Antonelli, Terry, Stout & Kraus, LLP

[57] ABSTRACT

An oriented polycrystal silicon film or an amorphous silicon film 52 is disposed on the whole area beneath a conductive diffusion barrier 61 under a lower electrode of a ferroelectric capacitor. As a result, the conductive diffusion barrier, the lower electrode and the capacitor ferroelectric film become oriented films; therefore, it is possible to reduce the signal variation in capacitors even in minute semiconductor devices, and obtain a highly reliable semiconductor device.

42 Claims, 11 Drawing Sheets

X-ray diffraction patterns of TiN films deposited on various underlayers

SEMICONDUCTOR DEVICE AND ITS MANUFACTURE

BACKGROUND OF THE INVENTION

The present invention relates to a large-scale integrated circuit (LSI) using minute capacitors, and a process for producing the same.

In order to obtain a given capacitance in a small planar area in a large-scale integrated circuit including a dynamic random access memory (DRAM), its structure has been complicated with the rise in high integration degree. Silicon oxide film or silicon nitride film used as a dielectric film for capacitors has a low dielectric constant; therefore, ferroelectric materials having a very large dielectric constant from several hundreds to several thousands have been investigated for use as a capacitor dielectric film as disclosed in Japanese Patent Application Laid-Open No. 63-201998.

Ferroelectric materials have spontaneous polarization, and the direction thereof can be reversed by an outer electric field. Therefore, by using this property, formation of nonvolatile memories has been attempted.

As the aforementioned ferroelectric materials, an oxide ferroelectric material such as lead zirconate titanate or bismuth layer ferroelectric material is commonly known. The memory using the ferroelectric material is a memory using the phenomenon that the spontaneous polarization of the ferroelectric material is reversed by a high electric filed value and the direction of spontaneous polarization corresponds to the information "1" and "0" in the memory. In order to read the information stored in the memory, an electric fieled is applied to the ferroelectric film to detect electric charges flowing out at that time. The spontaneous polarization is directed to a specific direction in the crystal, but in the thin film ordinarily composed of polycrystal, its average value corresponds to the effective amount of information.

As disclosed in, for example, Japanese Patent Application Laid-Open No. 3-256358, the structure of a memory is general one wherein a semiconductor substrate having a formed MOS transistor is coated with a dielectric material 81 (FIG. 13) and thereon a ferroelectric capacitor is formed and wherein one electrode of the ferroelectric capacitor is connected to the source or the drain of the MOS transistor by means of a conductive material 82 embedded inside a contact hole dug in the dielectric material. In this structure, a capacitor is formed to extend over a plug 82 in which poly silicon is embedded and an amorphous interlayer dielectric 81. The capacitor is made by means of an upper electrode 86, a ferroelectric film 85 and a lower electrode 84. The temperature for making the ferroelectric film 85 is 500° C. or more. Thus, the lower electrode 84 used commonly is made of platinum. However, a conductive diffusion barrier 83 such as Ti, Ta, TiN or TiSi$_2$ is disposed between the platinum electrode 84 and the polycrystal silicon layer 82, so as not to deteriorate the ferroelectric capacitor characteristics by the phenomenon that platinum is reacted with silicon to form a silicide or Si is diffused in platinum to form a Si oxide film on the surface of platinum. This conductive diffusion barrier 83 is polycrystal because it is formed on the polycrystal silicon layer 82 and the amorphous interlayer dielectric 81. For this reason, the ferroelectric film 85 formed thereon also becomes polycrystal. On the other hand, there is also known a structure wherein a conductive diffusion barrier is formed on polycrystal silicon, as described in Japanese Patent Application Laid-Open 6-5810, although the polycrystal silicon is not formed as an underlayer to improve the crystallinity of films formed thereon.

As memories are highly integrated, however, the area of a capacitor becomes smaller so that its size will become as small as the size of a crystallite of a ferroelectric material. In this state, spontaneous polarization is directed to the perpendicular direction to the substrate in a crystallite of a certain capacitor while spontaneous polarization is directed to the direction in parallel to the substrate for a crystallite of the other capacitor. In nonvolatile memories, therefore, spontaneous polarization values for their capacitors are largely varied so that the memories will incorrectly operate. Similarly, in DRAMs their signals are varied from cell to cell. Thus, it is necessary that the finite number of crystallites constituting respective capacitors are oriented to a specific direction. However, control of crystal orientation of the electrode on the capacitor cannot be expected in the case, as in the prior art memories, wherein the capacitor is formed to extend over the polycrystal silicon layer 82 and the amorphous interlayer dielectric 81, or wherein the capacitor is formed on the polycrystal silicon layer but it includes a very thin portion and crystallographic properties or surface roughness are not taken into account.

An object of the present invention is to provide a semiconductor device having capacitors whose spontaneous polarization does not vary from capacitor to capacitor, and are highly reliable and suitable for high integration; and a process for producing the semiconductor.

SUMMARY OF THE INVENTION

This object can be attained by disposing an orientated poly as it is, film or an amorphous as it is film under the whole area of diffusion barrier under a platinum lower electrode for a capacitor using a ferroelectric material.

It is preferred to arrange a conductive layer as a diffusion barrier (61) comprising TiN for preventing reaction of silicon with platinum between the aforementioned oriented semiconductor such as a polycrystal silicon film, or the amorphous semiconductor film such as an amorphous silicon film (FIG. 10, reference number 52) and the platinum lower electrode (62). The platinum lower electrode (62) is electrically connected to a desired area of the semiconductor element, for example, the source or the drain area (FIG. 8, reference number 25 and 26) of a MOS transistor through the diffusion barrier (61) conductive.

In the case of disposing a TiN film as the conductive diffusion barrier, the [111] orientation of the TiN film is preferred to prompt the [111] orientation of the platinum lower electrode. In order to obtain a platinum film having intense [111] orientation, the FWHM (full width at half maximum) of the rocking curve of the TiN [111] diffraction peak is preferably 12 degrees or less.

To form such a TiN film having intense [111] orientation, Ti is reactively sputtered under the condition of shortage of nitrogen-supply. The sputtering gas is inert gas, such as argon, which is preferably contains from 20 to 60% by mole of nitrogen. When the nitrogen-supply is insufficient, the formed TiN film contains excessive Ti and is liable to have [111] orientation.

More preferably, the TiN film is annealed in ammonia atmosphere after the formation to form a thin layer containing, as the main component, platinum thereon, in order to improve crystallinity and orientation of the TiN film formed under the aforementioned condition and further approximate its composition to stoichiometry for improvement in resistance to oxidization.

TiN has a crystal structure of sodium chloride type. Thus, when its [111] direction grows perpendicular to the substrate, the arrangement of atoms has similar to the [111] surface of platinum so that the platinum electrode film has higher [111] orientation. Furthermore, on the [111]-oriented platinum electrode ferroelectric material of a perovskite type, for example, lead zirconate titanate easily grows with [111] orientation. In the semiconductor device according to the present invention, the polycrystal silicon film is formed under the whole area of the TiN film. For this reason, the platinum electrode grows with [111]-orientation; therefore, the perovskite type ferroelectric material grows with [111]-orientation. In this oriented film, spontaneous polarization directions are the same each other so that polarization can be easily reversed and any memory cells can exhibit the same polarization values.

In the structure of TiN, which is used as an adhesion and diffusion barrier layer, platinum electrode, and PZT, the effects of the substrates on the [111] orientation of the lead zirconate titanate were investigated.

At first, a TiN film of 100 nm was formed on a silicon substrate by reactive sputtering process. The sputtering condition for TiN film formation is s follows; the inputted power was 200 W, the sputtering gas was argon containing from 20 to 60% of nitrogen gas, and its gas pressure was 20 mTorr, and the substrate was not heated. After that, a 20-nm-thick platinum film was formed by sputtering process. The sputtering condition for platinum film formation is as follows; the inputted power was 400 W. The sputtering gas was argon gas (100%), its gas pressure was 5 mTorr, and the substrate was heated to 300° C.

The results of X-ray diffraction demonstrated that TiN films formed on different substrate material or under the different sputtering gas compositions had different orientations such as [111] or [100] orientation. The [111] orientation of the platinum films formed on these TiN films were also varied by influence of the TiN underlayer. The FWHM of the Pt[111] rocking curve was changed within the range from 2 to 15 degrees. Furthermore, a 100-nm-thick lead zirconate titanate film was formed by sol-gel process. The sol was obtained by reacting lead acetate, titanium isopropoxide, and zirconium isoproxide in methoxy ethanol. The film was subjected to rapid thermal annealing at 650° C. for 2 minutes in oxygen atmosphere for crystallization. The films were evaluated by X-ray diffraction.

FIG. 1 shows the relationship between the FWHM of the Pt[111] rocking curve and the [111] degree of orientation for lead zirconate titanate (PZT) thin film. As understood from this figure, the [111] degree of orientation of the lead zirconate titanate thin film decreased with the FWHM of Pt[111] rocking curve. When the FWHM of Pt[111] the rocking curve is 5 degrees or less, lead zirconate titanate film is perfectly [111]-oriented.

FIG. 2 shows the relationship between the FWHM of the TiN[111] rocking curve and the FWHM of the Pt[111] rocking curve. As the FWHM of the TiN[111] rocking curve decreased, the FWHM of the Pt[111] rocking curve is also decreased. In order to form the Pt film whose FWHM of the [111] rocking curve is 5 degrees or less, it is necessary that the platinum film should be grown on TiN film whose FWHM of the [111] rocking curve is 12 degrees or less.

Next, FIG. 3 shows X-ray diffraction patterns of TiN films formed on an amorphous oxidized silicon film formed by CVD process, on a polycrystal silicon film formed on a heated Si substrate up to crystallization temperature and not exhibiting any specific orientation (hereafter called in-situ polycrystal silicon), on a polycrystal silicon film crystallized by post-annealing and having [111] orientation, and on an amorphous silicon film. The TiN films on the polycrystal silicon film having [111] orientation and on the amorphous silicon film clearly have higher [111]-orientation. The TiN films on the amorphous oxidized silicon film and on the polycrystal silicon film not exhibiting any orientation have bad crystallinity and dose not show strong orientation. The FWHM of the [111] rocking curve was 9 degrees for the TiN film on the polycrystal silicon film having [111] orientation while that for the TiN on the amorphous oxidized silicon film was 15 degrees or more. The orientation of the TiN film on the polycrystal silicon film not exhibiting any orientation was somewhat better than that of the TiN film on the amorphous oxidized silicon film. This is because silicon has larger surface energy and consequently it has smaller contact angle to the substrate than amorphous oxidized silicon, and the in-situ polycrystal silicon film does not exhibit any specific crystal orientation and has also large surface roughness. Accordingly, it has been found out that for forming a highly [111]-oriented TiN film it is necessary to choose the underlying material which has large surface energy, and also take into account the crystal orientation and roughness of the underlayer. The aforementioned silicon films are generally phosphorus-doped silicon films, but the crystal property of TiN films does not depend on the dopant concentration of phosphorus. This is because there are no big difference in Si growth rate in the temperature range of memory-cell process (<900° C.) although the crystallization temperature is lowered with the dopant level.

An upper gold electrode was formed using a metal mask, on 100-nm-thick lead zirconate titanate thin films derived by sol-gel process and their dielectric properties were examined. It was found out that the lead zirconate titanate thin films formed on the polycrystal silicon film having [111] orientation or on the amorphous silicon film had a small coercive field and showed a square hysteresis curve while the lead zirconate titanate thin films on the amorphous oxidized silicon film and on the in-situ polycrystal silicon film had a large coercive field and small remanent polarization. This is because the TiN films on the polycrystal silicon film having [111] orientation and on the amorphous silicon film have higher [111] orientation so that platinum will have higher [111] orientation and further the lead zirconate titanate thin film will have higher [111] orientation. However, as the amorphous silicon has somewhat high resistivity, it is preferred to be annealed after TiN deposition to be crystallized.

These results show that post annealed polycrystal silicon is needed as an underlayer of TiN.

As described above, a lead zirconate titanate thin film having good characteristics is formed on a TiN film intense [111] orientation. Thus, the condition for forming such a TiN film was examined. FIG. 4 shows the relationship between the flow ratio of argon and nitrogen in reactive sputtering process and the FWHM of the TiN [111] rocking curve. When the percentage of nitrogen flow was from 20 to 60%, a TiN film was formed whose FWHM of the TiN [111] rocking curve was less than 10 degrees. This may be attributed to the preferred orientation of titanium when TiN film is formed under the condition of supplying excessive titanium.

Furthermore, the TiN film was annealed in ammonia gas to improve [111] orientation. FIG. 5 shows the annealing temperature dependence of the molar ratio of N to Ti in the TiN film and the FWHM of the TiN [111] rocking curve. When the TiN film is annealed at the temperature more than 650° C., the FWHM of the TiN [111] rocking curve drastically decreased and the molar ratio of N to Ti was increased.

When the annealing treatment was conducted at the temperature of 750° C. or higher, this effect was especially remarkable. It has been found out that use of TiN film annealed in ammonia in such a manner affects the lead zirconate titanate thin film to have higher [111]-orientation, and also improves the degree of nitrization, thereby improving resistance to oxidization.

According to the present invention, therefore, spontaneous polarization is not varied from capacitor to capacitor wherein the crystal orientation of their ferroelectric material is controlled, and consequently it is possible to obtain a highly reliable semiconductor device.

DESCRIPTION OF THE PREFERRED EMBODIMENTS

EXAMPLE 1

Figure 9:
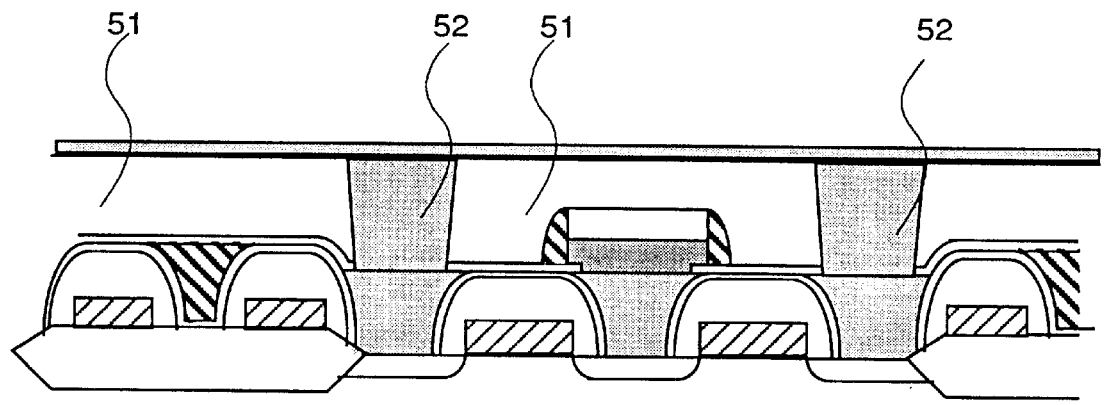
Figure 10:
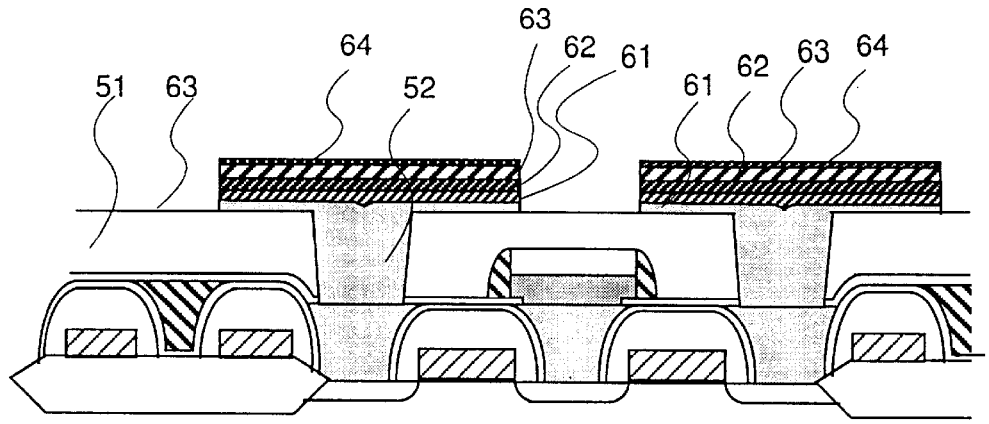
Figure 11:
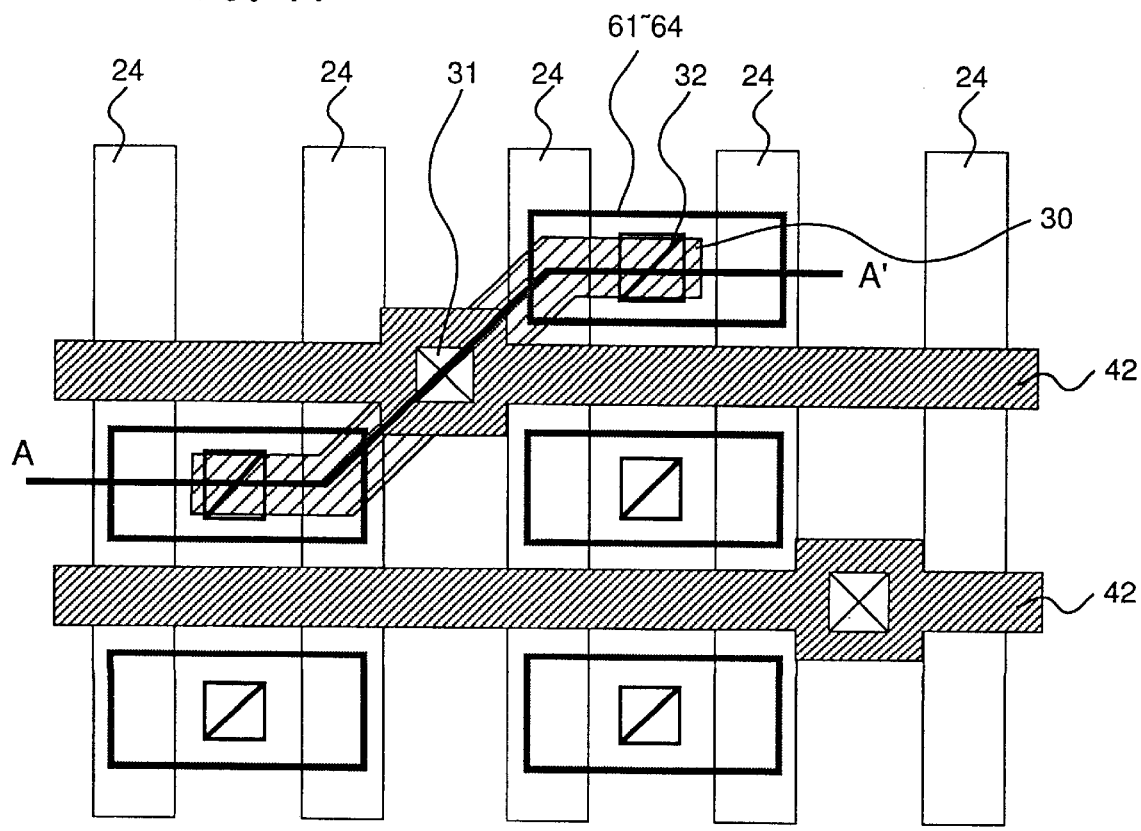
FIG. 11 is a top view illustrating the memory cell according to the invention.
Figure 14:
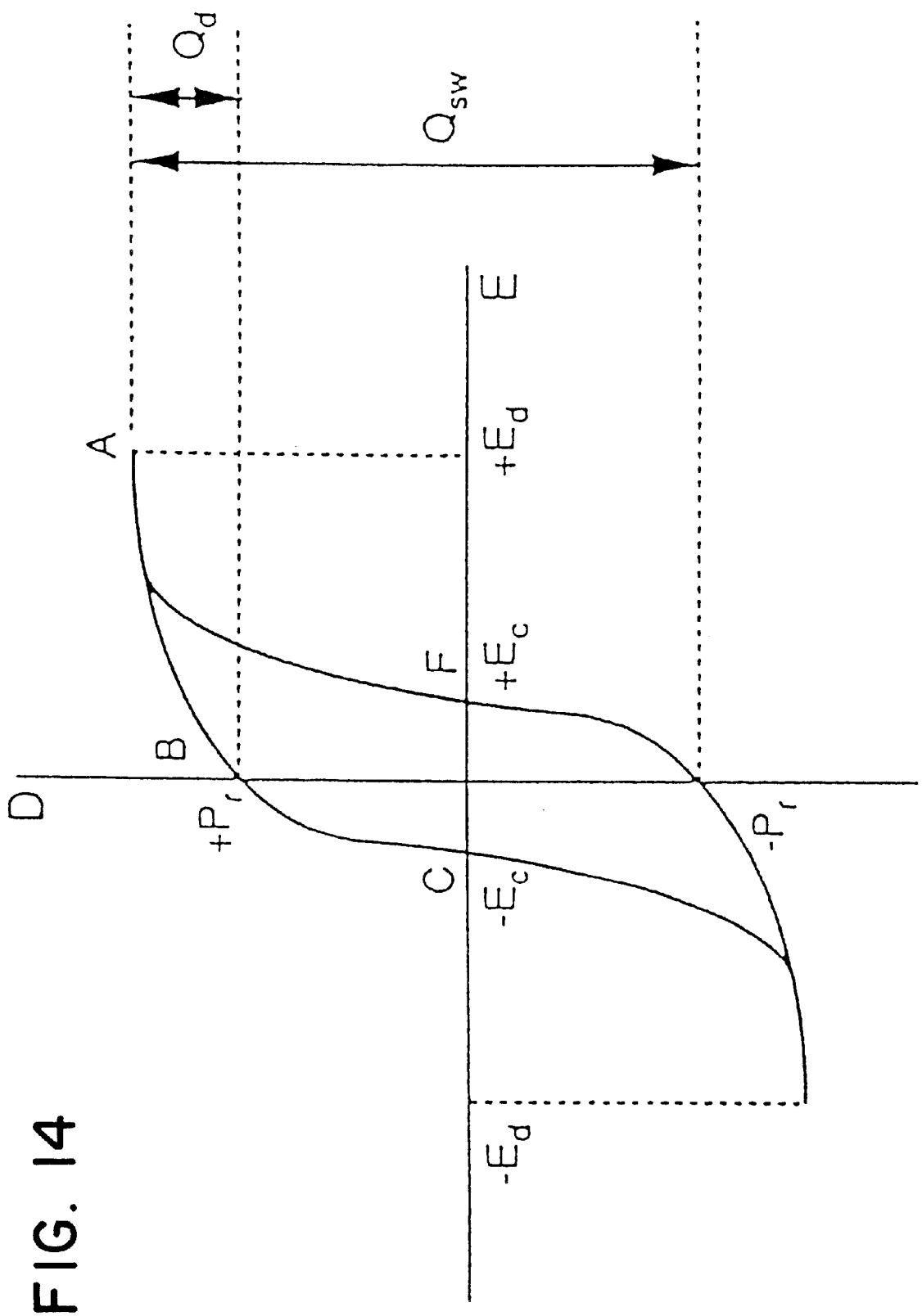
FIG. 14 shows the amount of electric charges when the spontaneous polarization in a ferroelectric material is reversed and non-reversed.

FIGS. 6–10 illustrate the steps of producing an example of memory cells using the invention, and FIG. 11 shows a top view of the memory cells. The cross sections illustrated in FIGS. 6–10 are ones along the A–A' direction in FIG. 11. In the present invention, a capacitor-over-bitline-type stack structure described in Japanese Patent Application Laid-Open No. 3-256356 was used, and a storage capacitor had a flat structure. This cell structure works as nonvolatile memories when it is operated so as to read the amount of switching charges Qsw or non-switching charges Qd depending on the polarization state while it functions as DRAW when it is operated to read the non-reversal charges Qd as shown in FIG. 14.

Figure 1:
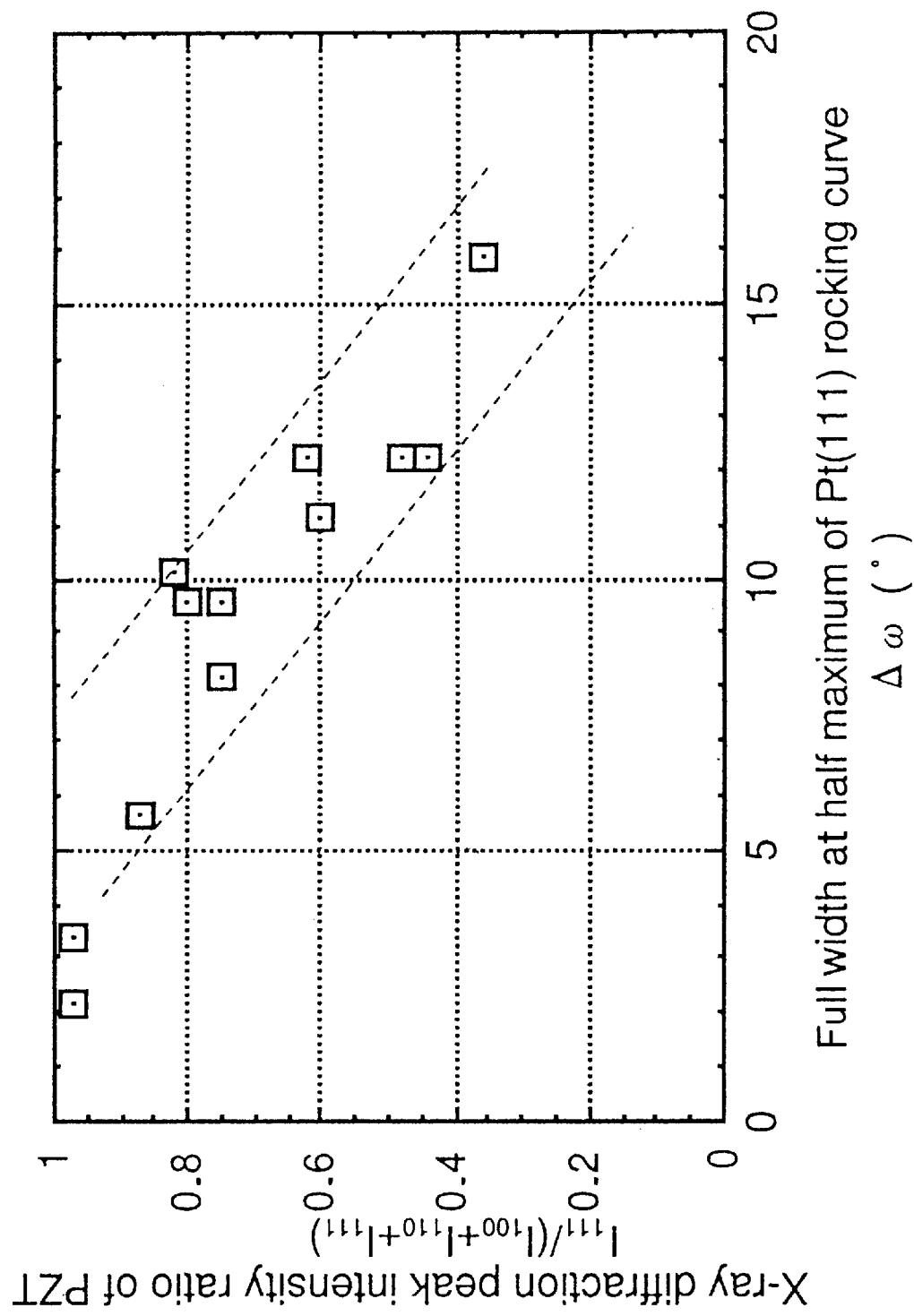
FIG. 1 shows the relationship between the FWHM of a Pt [111] rocking curve and the ratio of PZT [111] diffraction peak intensity.
Figure 2:
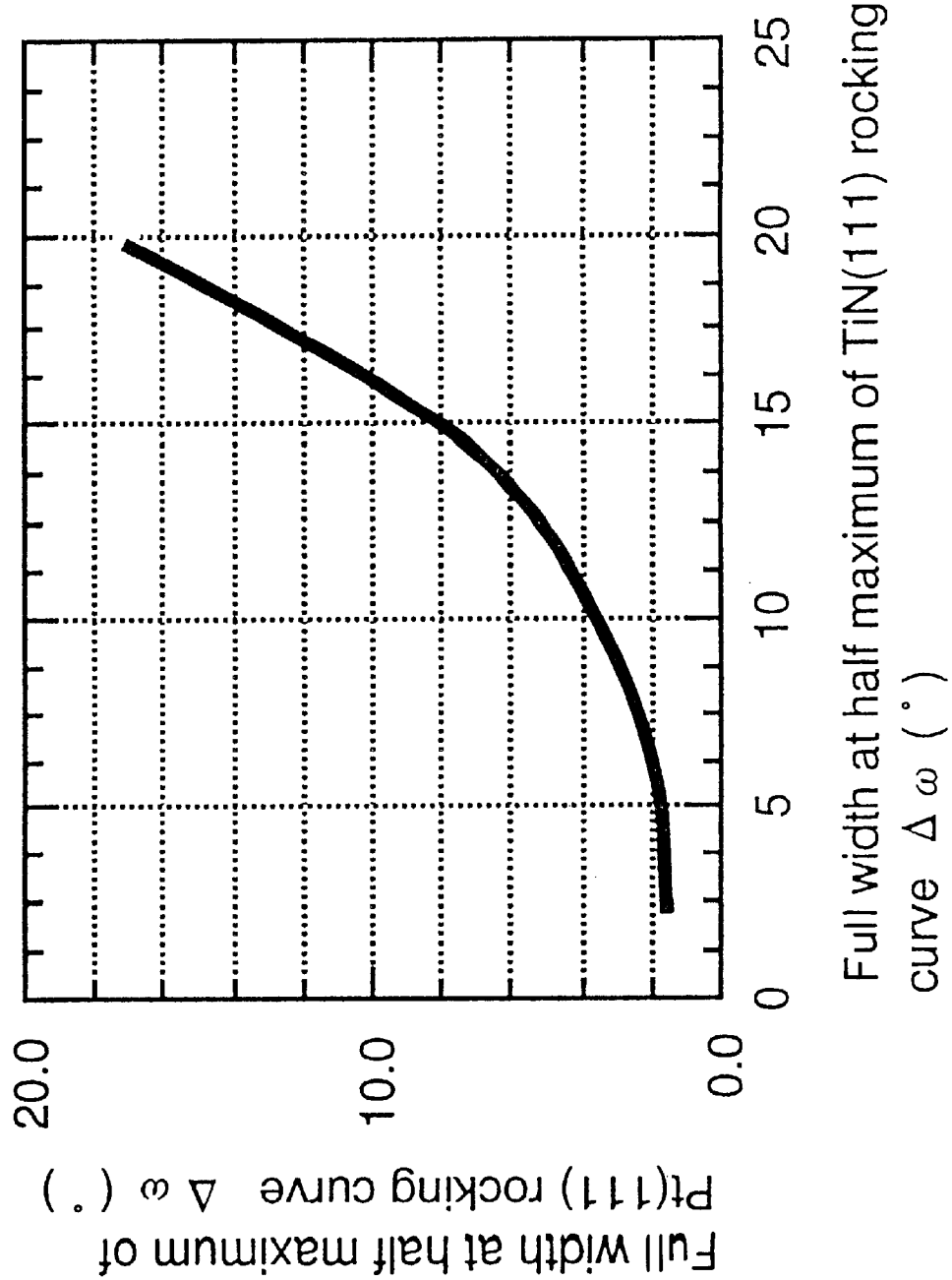
FIG. 2 shows the relationship between the FWHM of a TiN [111] rocking curve and he FWHM of a Pt [111] rocking curve.
Figure 3:
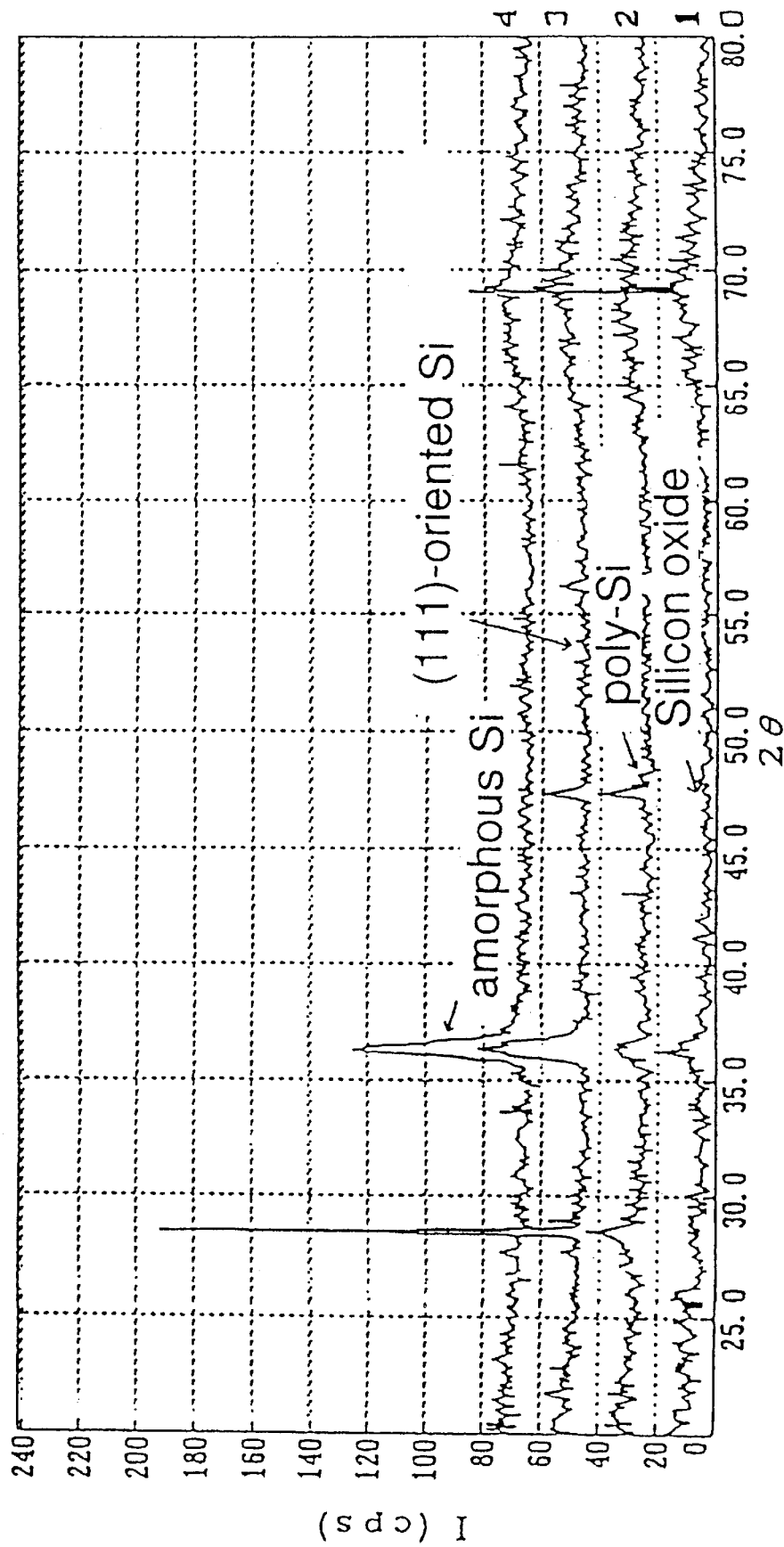
FIG. 3 shows X-ray diffraction patterns of TiN films formed on amorphous silicon, [111] orientated polycrystal silicon, polycrystal silicon and amorphous silicon.
Figure 4:
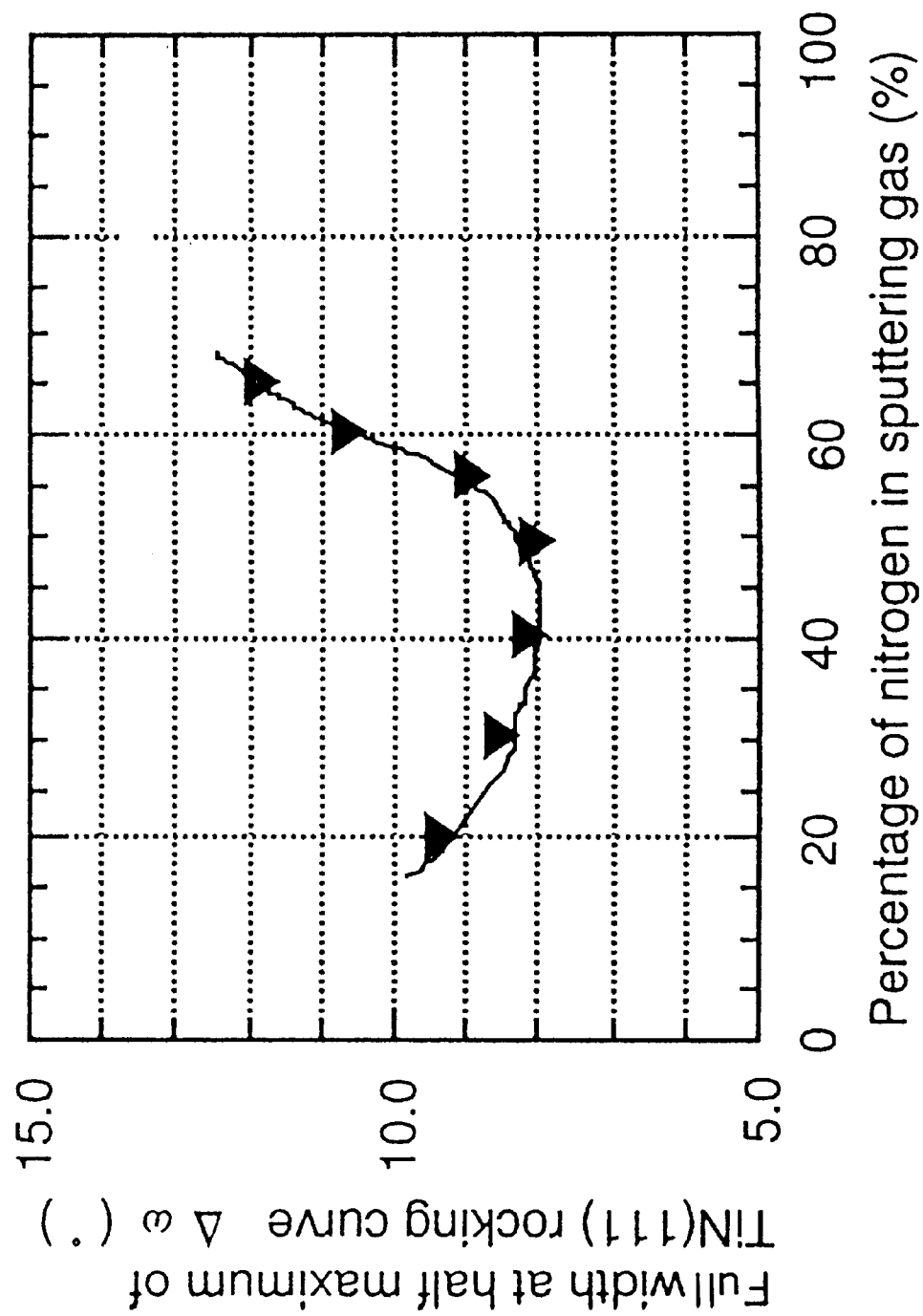
FIG. 4 shows the dependence of the HWHM of a TiN [111] rocking curve on the percentage of nitrogen flow.
Figure 5:
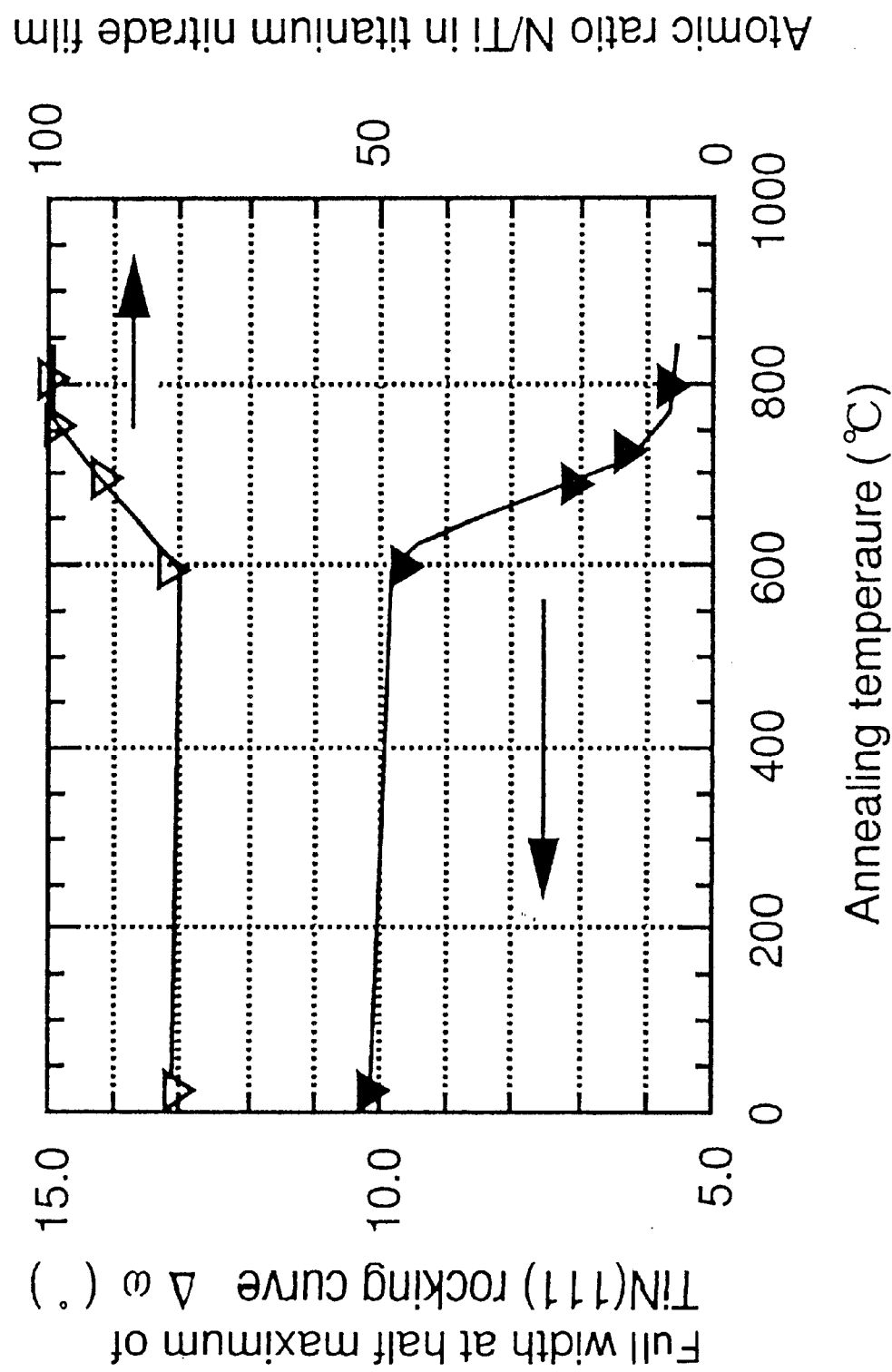
FIG. 5 shows annealing temperature dependence of the FWHM of a TiN [111] rocking curve, and the atomic ratio N/Ti in the TiN film.
Figure 6:
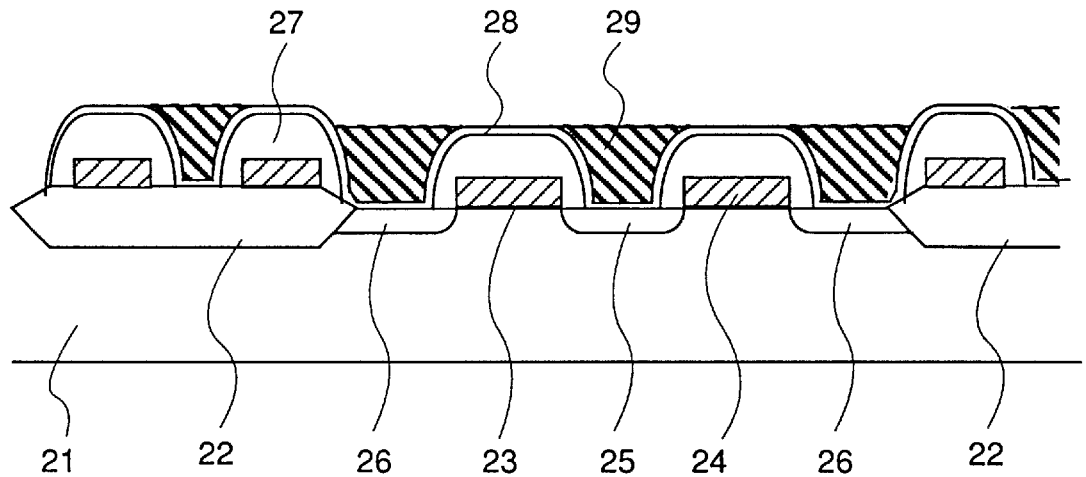
FIGS. 6–10 are cross sections showing a process for producing a memory cell according to the present invention.

As shown in FIG. 6, a switching transistor is firstly formed by a conventional MIS type FET producing process. Herein, 21 represents a p-type semiconductor substrate, 22 represents an isolation dielectric film, 23 represents a gate oxide film, 24 represents a word line which will be a gate electrode, 25 and 26 represent n-type dopant layers (phosphorus), and 27 represents an interlayer dielectric. A known CVD process is used to form a 50-nm-thick $SiO_2$ film 28 and a 600-nm-thick $Si_3N_4$ film, respectively, on the whole surface, and then the $Si_3N_4$ film is etched off, by the thickness thereof, to embed the dielectric film between the word lines. The $SiO_2$ films 28 is an undercoat when bit lines are processed in the next step, and functions to prevent exposure of the surface of the substrate and etch-off of isolation dielectric film.

Figure 7:
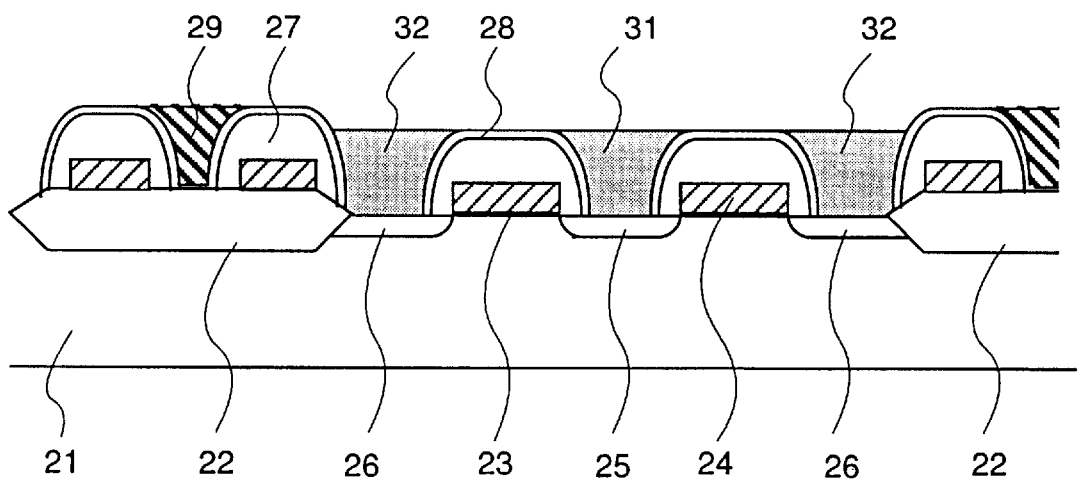

Subsequently, as shown in FIG. 7, portions 25 where the bit lines will contact the n-type diffusion layers at the surface of the substrate and portions 26 where the electrodes will contact the n-type dopant layers at the surface of the substrate 26 are bored by known photolithographic and dry etching processes. A 600-nm-thick polycrystal silicon film containing an n-type dopant is deposited using CVD process, and then etching is carried out by its thickness, so that polycrystal silicon films 31 and 32 are filled into the contact holes formed by the aforementioned etching.

Figure 8:
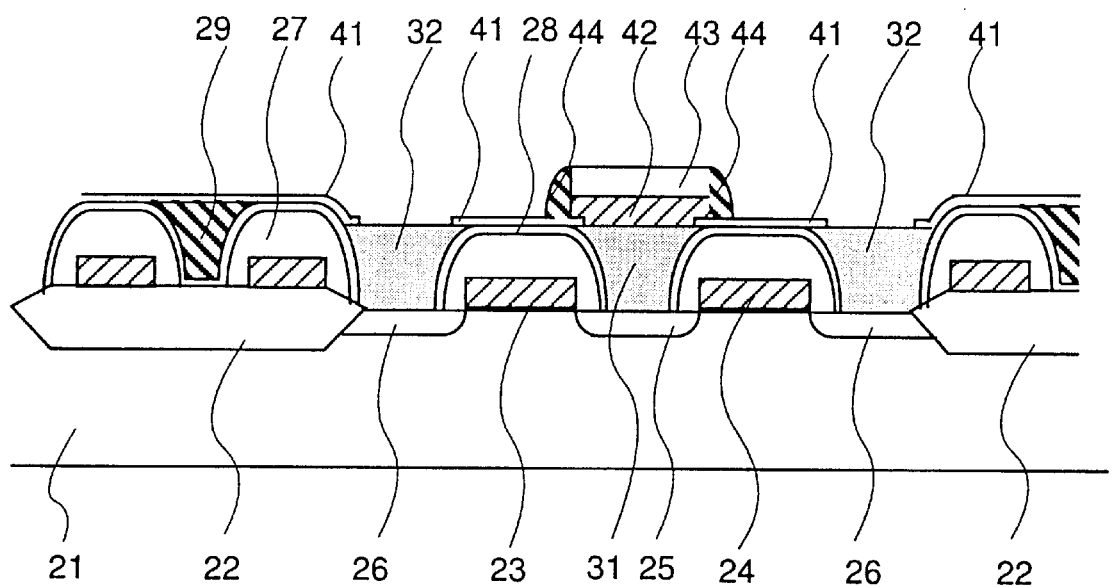

Next, as shown in FIG. 8, a known CVD process is used to deposit a dielectric film 41 on the whole surface, and then the dielectric film 41 on the polycrystal silicon film 31 is bored by known photolithographic and dry etching processes in order that the bits lines will be electrically connected to the diffusion layer 25 in the substrate. Subsequently, the bit lines 42 are formed. As a material for the bit lines, a stacked film of metal silicide and polycrystal silicon was used. Thereon, a 200-nm-thick $SiO_2$ film 43 is deposited. The $SiO_2$ film 43 and the bit lines 42 are processed by known photolithographic and dry etching processes. Furthermore, a 150-nm-thick $Si_3N_4$ film is deposited by CVD process, and etched by dry etching process to form side wall spacers of $Si_3N_4$ on the side walls of the bit lines, thereby insulating the bit lines. The dielectric film 41 on the polycrystal silicon film 32 was bored by using known photolithographic and dry etching processes.

Subsequently, as shown in FIG. 9, a silicon oxide film 51, such as BPSG, is deposited to planerize the substrate surface. It is necessary that this dielectric film 51 has a thickness sufficient to planerize the substrate surface. In the present example, the thickness of the dielectric film 51 was 500 nm. Another possible process is depositing a $SiO_2$ film on the substrate by CVD process and etching back the surface. Known photolithographic and dry etching processes are used to make a contact hole in the interlayer dielectric film 51. A phosphorus-doped amorphous silicon film of 250 nm-thick 52 for embedding is then deposited by CVD process, and subsequently etch back is carried out by dry etching process to fill up in the contact holes. At this time, the phosphorus-doped amorphous silicon film of 50-nm-thick 52 remains on the silicon oxide 51, without being etched. It is necessary that the phosphorus-doped amorphous silicon film has a thickness of 10 nm or more for maintaining good crystal property after annealing treatment. If the thickness is too large, the height of the capacitor stack increases. It is difficult that a thin silicon film of from 10 to 30 nm is kept unetched. In this case, therefore, etch back is carried out until the interlayer dielectric is etched away from the phosphorus-doped amorphous silicon film for embedding, and then a new phosphorus-doped amorphous silicon film is again formed. This process is well controlled.

Next, as shown in FIG. 10, a 100-nm-thick TiN film 61 are formed as a diffusion barrier and a 100-nm-thick platinum electrode 62 are formed. In the present invention, the TiN film 61 was formed by DC sputtering process using 50% nitrogen and 50% argon. Then, a lead zirconate titanate thin layer 63 was formed by sol-gel process, and then an about 50 nm platinum upper electrode 64 was formed using sputtering process. The five layers on the phosphorus-doped amorphous silicon film 52 are etched at one time as follows. A 250-nm-thick tungsten film is firstly formed as a hard mask, and a photoresist pattern is transcribed on the tungsten film by sputter etching in argon gas using a photoresist as a mask. Using this tungsten film as a mask, the Pt film 64, the lead zirconate titanate thin layer 63, the platinum lower electrode 62 and the TiN film 61 are succesively patterned. Then, it is coated with an interlayer dielectric and then melalization was done to connect the upper platinum electrode, so as to complete a capacitor in memory cells. In FIG. 10, however, interlayer dielectric and metalization are not shown to avoid complication of the figure. In the case wherein the angle of the side wall to the bottom face of the aforementioned five layers is less than 75 degrees, the shortcircuit between the upper and lower electrodes caused by deposition on the side walls can be prevented even if the capacitor is etched at one time.

The dielectric property of this capacitor was measured. For the capacitors of 0.2 to 100 $\mu m^2$, a square hysterisis curves were obtained in all cases, and the size-dependency of spontaneous polarization was not found. This is because the underlayer of the TiN film was wholly composed of phosphorus-doped amorphous silicon films and consequently the TiN film had [111] orientation and the lead zirconate titanate thin layer also had [111] orientation.

Similar property was obtained when the lead zirconate titanate $(Pb(Zr_{0.5}Ti_{0.5})O_3)$ thin layer was formed by using high frequency magnetron sputtering process. The sputtering condition as follows; the high frequency power was 200 W. argon gas containing 10% of oxygen was used as sputtering gas, and its gas pressure was 10 Pa. The temperature of a substrate was 650° C. Thus, a crystallized PZT film was directly formed. If the lower electrode and the diffusion barrier are formed in this manner according to the process in the present invention, the diffusion barrier is not oxidized in the crystallization process of an amorphous ferromlectric material by post annealing or in the process wherein a crystallized film is directly formed. Accordingly, reactive vapor deposition or CVD process may be used.

In the aforementioned example, lead zirconate titanate $(Pb(Ti_xZr_{1-x})O_3)$ wherein X=0.5 was given as an example of the ferroelectric material. However, even if lead zirconate titanate having different compositions, barium lead zirconate titanate, or a bismuth layered ferroelectric material is used, and a memory cell can be formed similarly.

EXAMPLE 2

Figure 12:
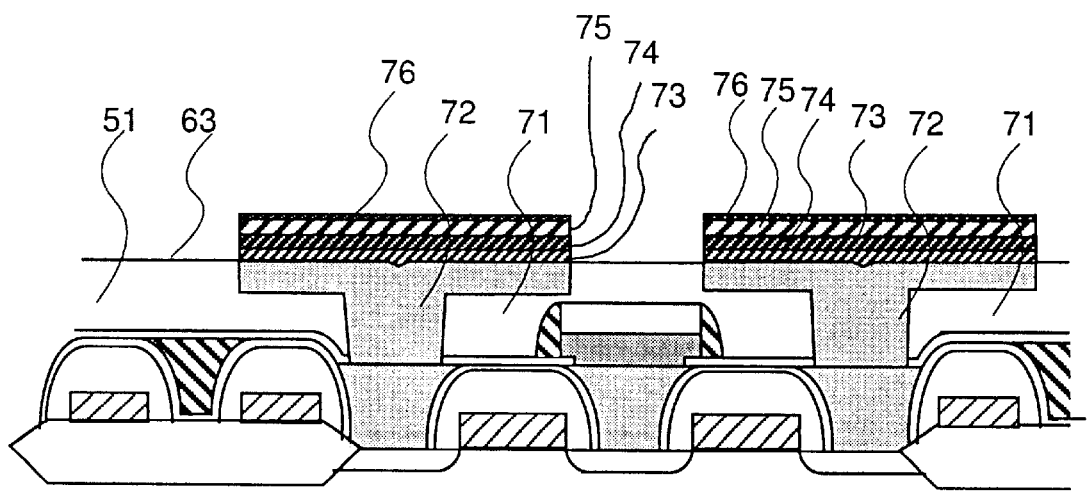
FIG. 12 is a cross section of the memory cell according to the invention.
Figure 13:
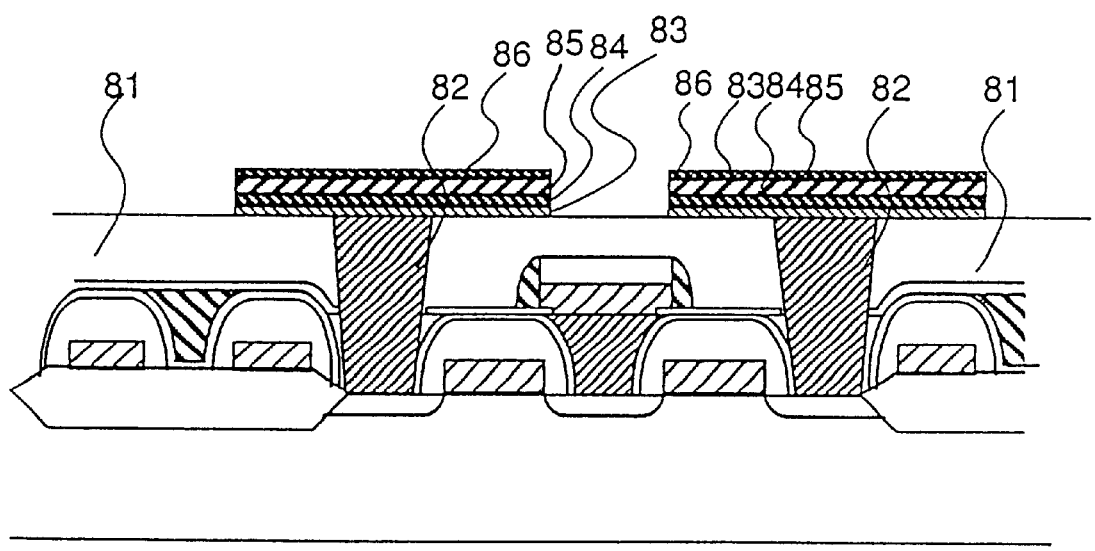
FIG. 13 is a cross section of a memory cell in the prior art.

In Example 1, the phosphorus-doped amorphous silicon film for embedding was left and it functioned as an underlayer for the TiN film. However, as shown in FIG. 12, interlayer dielectric and contact holes may be formed in two-step, and the contact holes in the second layer can be made larger. In this case, phosphorus-doped amorphous silicon layers for embedding are, by the thickness of the respective interlayer dielectrics, formed and the phosphorus-doped amorphous silicon layer is subjected to etch-back to be just embedded. The process for producing the capacitor is the same as in Example 1. The hight of the capacitor can be made smaller by embedding the portion connected to the substrate into the interlayer dielectrics in such a manner as mentioned above.

As described above, the present invention is applied to all of volatile and nonvolatile semiconductor devices using a capacitor.

What is claimed is:
1. A semiconductor device comprising:

a semiconductor substrate;
an insulating film formed over said semiconductor substrate;
a ferroelectric capacitor formed over said insulating film and having a lower electrode and an upper electrode between which a ferroelectric film is sandwiched;
an oriented semiconductor film formed on said insulating film; and
a diffusion barrier formed on said oriented semiconductor film,
wherein said lower electrode is formed on said diffusion barrier so that the whole under surface of said lower electrode is in contact with said diffusion barrier, and wherein the whole under surface of said diffusion barrier is in contact with said oriented semiconductor film such that the under surface of the diffusion barrier is not in direct contact with said insulating film.

2. A semiconductor device according to claim 1, wherein said oriented semiconductor film is comprised of an oriented polycrystal silicon film.

3. A semiconductor device according to claim 2, wherein said oriented polycrystal silicon film has a thickness of from 10 nm to 30 nm.

4. A semiconductor device according to claim 1, wherein said oriented semiconductor film is comprised of a silicon film having a [111] orientation.

5. A semiconductor device according to claim 2, wherein said diffusion barrier is comprised of an oriented titanium nitride film.

6. A semiconductor device according to claim 1, wherein said diffusion barrier is comprised of a titanium nitride film having a [111] orientation.

7. A semiconductor device according to claim 2, wherein said diffusion barrier is comprised of a titanium nitride film having a [111] orientation, and the full width at half maximum value of the [111] rocking curve is 12 degrees or less.

8. A semiconductor device according to claim 2, wherein said lower electrode is comprised of a platinum electrode having a [111] orientation, and the full width at half maximum value of the [111] rocking curve is 5 degrees or less.

9. A semiconductor device according to claim 6, wherein said lower electrode is comprised of platinum.

10. A semiconductor device according to claim 7, wherein said lower electrode is comprised of platinum.

11. A semiconductor device according to any one of claims 1 to 10,
wherein said ferroelectric film is comprised of an oxide ferroelectric material.

12. A semiconductor device according to claim 11, wherein said oxide ferroelectric material is comprised of lead zirconate titanate.

13. A semiconductor device comprising:
a semiconductor substrate;
an insulating film formed over said semiconductor substrate;
a ferroelectric capacitor formed over said insulating film and having a lower electrode and an upper electrode between which a ferroelectric film is sandwiched;
an amorphous semiconductor film formed on said insulating film; and
a diffusion barrier is formed on said amorphous semiconductor film, wherein said lower electrode is formed on said diffusion barrier so that the whole under surface of said lower electrode is in contact with said diffusion barrier, and wherein the whole under surface of said diffusion barrier is in contact with said amorphous semiconductor film such that the under surface of said diffusion barrier is not in direct contact with the insulating film.

14. A semiconductor device according to claim 13, wherein said amorphous semiconductor film is comprised of an amorphous silicon film.

15. A semiconductor device according to claim 13, wherein said amorphous silicon film has a thickness of from 10 nm to 30 nm.

16. A semiconductor device according to claim 13, wherein said diffusion barrier is comprised of an oriented titanium nitride film.

17. A semiconductor device according to claim 13, wherein said diffusion barrier is comprised of a titanium nitride film having a [111] orientation.

18. A semiconductor device according to claim 13, wherein said diffusion barrier is comprised of a titanium nitride film having a [111] orientation, and the full width at half maximum value of the [111] rocking curve is 12 degrees or less.

19. A semiconductor device according to claim 16, wherein said lower electrode is comprised of a platinum electrode having a [111] orientation, and the full width at half maximum value of the [111] rocking curve is 5 degrees or less.

20. A semiconductor device according to claim 17, wherein said lower electrode is comprised of platinum.

21. A semiconductor device according to claim 18, wherein said lower electrode is comprised of platinum.

22. A semiconductor device according to any one of claims 13 to 21,
wherein said ferroelectric film is comprised of an oxide ferroelectric material.

23. A semiconductor device according to claim 22, wherein said oxide ferroelectric material is comprised of lead zirconate titanate.

24. A semiconductor device comprising:
a semiconductor substrate;
an insulating film formed over said semiconductor substrate;
a dielectric capacitor formed over said insulating film and having a lower electrode and an upper electrode between which a ferroelectric film is sandwiched; and
an oriented semiconductor film or an amorphous semiconductor film formed on said insulating film;
wherein said insulating film and said lower electrode face each other across said oriented semiconductor film or said amorphous semiconductor film such that the whole under surface of said lower electrode is separated from said insulating film by said oriented semiconductor film or said amorphous semiconductor film.

25. A semiconductor device according to claim 24, wherein said oriented semiconductor film or said amorphous semiconductor film is comprised of an oriented polycrystal silicon film or an amorphous silicon film.

26. A semiconductor device according to claim 25, wherein said oriented polycrystal silicon film or said amorphous silicon film has a thickness of from 10 nm to 30 nm.

27. A semiconductor device according to claim 9, wherein said lower electrode is comprised of a platinum electrode having a [111] orientation, and the full width at half maximum value of the [111] rocking curve is 5 degrees or less.

28. A semiconductor device according to claim 25, wherein said lower electrode is comprised of platinum.

29. A semiconductor device according to claims 24–28, wherein said ferroelectric film is comprised of an oxide ferroelectric material.

30. A semiconductor device according to claim 29, wherein said oxide ferroelectric material is comprised of lead zirconate titanate.

31. A semiconductor device comprising:
a semiconductor substrate;
a MIS transistor formed on the main surface of said semiconductor substrate, and having a gate electrode, a source area and drain area;
an insulating film formed over said semiconductor substrate and said MIS transistor, and having a contact hole disposed above said source area or said drain area;
a conductive film embedded in said contact hole, and electrically connected to said source area or said drain area;
an oriented semiconductor film or an amorphous semiconductor film formed on said conductive film and on the upper surface of said insulating film;
a diffusion barrier formed on said oriented semiconductor film or said amorphous semiconductor film; and
a ferroelectric capacitor formed on said diffusion barrier, and having a first electrode, a second electrode disposed over said first electrode and a ferroelectric film disposed between said first electrode and said second electrode,
wherein said first electrode is formed on said diffusion barrier, wherein the whole lower surface of said first electrode is opposite the upper surface of said oriented semiconductor film or said amorphous semiconductor film, and wherein the whole lower surface of said diffusion barrier is not in direct contact with said insulating film.

32. A semiconductor device according to claim 31, wherein said oriented semiconductor film or said amorphous semiconductor film is comprised of an oriented polycrystal silicon film or an amorphous silicon film.

33. A semiconductor device according to claim 32, wherein said oriented polycrystal silicon film or said amorphous semiconductor film has a thickness of from 10 nm to 30 nm.

34. A semiconductor device according to claim 31, wherein said oriented semiconductor film is comprised of a silicon film having a [111] orientation.

35. A semiconductor device according to claim 32, wherein said diffusion barrier is comprised of an oriented titanium nitride film.

36. A semiconductor device according to claim 34, wherein said diffusion barrier is comprised of a titanium nitride film having a [111] orientation.

37. A semiconductor device according to claim 32, wherein said diffusion barrier is comprised of a titanium nitride film having a [111] orientation, and the full width at half maximum value of the [111] rocking curve is 12 degrees or less.

38. A semiconductor device according to claim 35,
wherein said first electrode is comprised of a platinum electrode having a [111] orientation, and the full width at half maximum value of the [111] rocking curve is 5 degrees or less.

39. A semiconductor device according to claim 36,
wherein said first electrode is comprised of platinum.

40. A semiconductor device according to claim 37,
wherein said first electrode is comprised of platinum.

41. A semiconductor device according to any one of claims 31 to 40,
wherein said ferroelectric film is comprised of an oxide ferroelectric material.

42. A semiconductor device according to claim 25,
wherein said oxide ferroelectric material is comprised of lead zirconate titanate.

* * * * *